United States Patent
Renegarajan et al.

(10) Patent No.: US 6,867,472 B2
(45) Date of Patent: Mar. 15, 2005

(54) REDUCED HOT CARRIER INDUCED PARASITIC SIDEWALL DEVICE ACTIVATION IN ISOLATED BURIED CHANNEL DEVICES BY CONDUCTIVE BURIED CHANNEL DEPTH OPTIMIZATION

(75) Inventors: Rajesh Renegarajan, Poughkeepsie, NY (US); Giuseppe LaRosa, Fishkill, NY (US); Mark Dellow, Wappingers Falls, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 68 days.

(21) Appl. No.: 10/338,517

(22) Filed: Jan. 8, 2003

(65) Prior Publication Data

US 2004/0142500 A1 Jul. 22, 2004

(51) Int. Cl.⁷ .............................................. H01L 29/00
(52) U.S. Cl. ...................... 257/510; 257/514; 257/515; 257/404

(58) Field of Search ................................ 257/510, 514, 257/515, 404

(56) References Cited

U.S. PATENT DOCUMENTS

| | | | |
|---|---|---|---|
| 4,885,617 A | 12/1989 | Mazure-Espejo et al. | |
| 5,940,717 A | 8/1999 | Rengarajan et al. | |
| 6,140,208 A | 10/2000 | Agahi et al. | |
| 6,521,493 B1 * | 2/2003 | Alsmeier et al. | 438/199 |
| 6,747,318 B1 * | 6/2004 | Kapre et al. | 257/368 |

* cited by examiner

Primary Examiner—Mark V. Prenty
(74) Attorney, Agent, or Firm—Edell, Shapiro & Finnan, LLC

(57) ABSTRACT

A semiconductor device includes a transistor junction formed in a substrate adjacent to an isolation region. A region between the transistor junction and the isolation region includes an area susceptible to hot carrier effects. The transistor junction extends from a surface of the substrate to a first depth. A buried conductive channel layer is formed within the transistor junction between the surface of the substrate and the first depth. The buried conductive channel layer has a peak conduction depth, which is different from a depth of the area susceptible to hot carrier effects.

19 Claims, 9 Drawing Sheets

US 6,867,472 B2

REDUCED HOT CARRIER INDUCED PARASITIC SIDEWALL DEVICE ACTIVATION IN ISOLATED BURIED CHANNEL DEVICES BY CONDUCTIVE BURIED CHANNEL DEPTH OPTIMIZATION

BACKGROUND

1. Technical Field

This disclosure relates to semiconductor fabrication, and more particularly, to method for reducing hot carrier effects in buried channel metal oxide semiconductor field effect transistor (MOSFET) solid state devices.

2. Description of the Related Art

A dynamic random access memories (DRAMs) include an array area which typically has transistors and capacitors. The capacitors are typically configured to store a charge, which can be accessed by appropriate support circuitry associated with the DRAM. Typically, the array circuitry and the support circuitry of the DRAM are located in different areas of the integrated circuit (IC). Although transistors are present in both the array area and the support area of the DRAM, N-FETs (N-channel Field Effect Transistors) are typically employed in the array area, while P-FETs (P-channel Field Effect Transistors) are generally employed in the support circuitry area. The transistors are typically implemented in wells, which are created in the substrate of the integrated circuit. These wells are separated, in some circuits, by shallow trench isolation structures.

Referring to FIG. 1, a region between a transistor 101 and a shallow trench isolation (STI) structure 100 is illustratively shown. STI 100 and transistor 101 are created in a silicon substrate 102. Transistor 101 includes a gate dielectric layer 110 formed on a surface 113 of substrate 102, and a gate conductor 112 formed on gate dielectric layer 110. Transistor 101 includes a junction 114, which abuts STI 100. STI 100 typically includes an oxide layer 120, a nitride layer or liner 122 and an oxide fill material 124. STI 100 electrically isolates a sidewall of transistor 101.

When gate conductor 112 is activated, an electric field, E, is applied to junction 114 as indicated by electric field lines 126 and conduction occurs through junction 114. STI 100 is provided to electrically isolate junction 114 from other devices formed on substrate 102. However, due to the isolation process, a localized area 130 along STI 100 is more sensitive to hot carrier damage. Area 130 in this case includes a divot 128 and nitride layer 122 which induces charge trapping and causes localized damage during operation of transistor 101 due to hot carrier effects. Area 130 is also responsible for parasitic leakage in transistor 101.

It is difficult to control the depth of divot 128 created by an etch process employed to strip a pad nitride layer (not shown). Since the gate conductor 112 (e.g., polysilicon) is subsequently deposited into this divot region 128, the variable depth of divot region 128 leads to a variable amount of polysilicon wrapped around the gate of transistor 101. This affects control of the threshold voltage of the gate to be formed, thereby degrading performance of transistor 101 during operation. However, the proximity of nitride liner 122 to the transistor channel disadvantageously exacerbates the hot carrier reliability problem for P-FET transistors. Hot carrier reliability problems are caused when nitride liner 122 traps or collects charge that should traverse the P-FET channels located near STI 100. Nitride liner 122 reduces dislocation density in substrate 102. As can be appreciated by those skilled in the art, hot carrier reliability problems increase power consumption of the P-FET transistors and, in some cases, may lead to incorrect timing of the circuitry.

The activation of a parasitic sidewall device in area 130 during hot carrier stresses is one of the main concerns in Buried Channel PMOSFETs technologies with STI isolation. For example, the enhanced hot carrier sensitivity is a limiting factor for an aggressive burn-in strategy (for testing manufactured chips) and constrains the device/circuit design. This phenomenon can take place in buried channel PMOS devices controlled by electron trapping localized in the gate-sidewall-drain region, as indicated in FIG. 1, and results in an increase in the device threshold voltage, $V_{th}$, (i.e., the device is easier to turn on).

The activation of a parasitic sidewall device in area 130 increases in buried channel PMOS devices due to hot carrier aging. This has been established to be the main contributor to the increase in the chip stand-by current in single workfunction DRAM technologies with STI with nitride liner isolation.

The presence of nitride liner 122 increases the electron trapping efficiency in a localized region around the nitride liner 122 and below divot 128. If the point of electron injection along the sidewall is close to area 130, the device will be more sensitive to the parasitic sidewall activation. This effect can be also produced by any process that can produce a localized region of enhanced electron trapping.

Therefore, a need exists for reducing hot carrier reliability problems in semiconductor devices by providing a buried channel, which avoids areas of high hot carrier sensitivity.

SUMMARY OF THE INVENTION

A semiconductor device includes a transistor junction formed in a substrate adjacent to an isolation region. A region between the transistor junction and the isolation region includes an area susceptible to charge trapping. The transistor junction extends from a surface of the substrate to a first depth. A buried conductive channel layer is formed within the transistor junction between the surface of the substrate and the first depth. The buried conductive channel layer has a peak conduction depth, which is different from a depth of the area susceptible to charge trapping.

Another semiconductor device of the present invention includes a transistor device formed in a substrate adjacent to an isolation region, and the transistor device includes a junction region activated by a gate conductor to conduct charge through the junction region, the junction region extending from a surface of the substrate to a first depth. A region is disposed between the junction region and the isolation region and includes an area susceptible to charge trapping. A charge injection region formed in the junction provides a peak charge transfer layer through the junction region. The charge injection region has a peak conduction depth, which is different from a depth of the area susceptible to charge trapping.

In other embodiments, the isolation region may include a shallow trench isolation region. The shallow trench isolation region may include a nitride liner and the area susceptible to hot carrier effects may include an area between the nitride liner and the transistor junction. The peak conduction depth may be below the depth of the area susceptible to hot carrier effects. The peak conduction depth may be above the depth of the area susceptible to hot carrier effects. The buried conductive channel layer may include, boron, boron difluoride dopants, arsenic, etc. The charge injection region preferably includes a buried conductive channel layer. The charge injection region includes dopants, and the dopants may include boron or arsenic. The region disposed between the junction region and the isolation region may include a divot disposed between the junction region and the isolation region, the divot being filled by the gate conductor.

A method for reducing hot carrier effects in a transistor device in accordance with the present invention includes the steps of determining a first depth within a junction of the transistor which is sensitive to hot carrier effects, and forming a buried conductive channel at a second depth which is different from the first depth. In other methods, the step of determining the first depth may include the step of analyzing a device structure to determine a position likely to cause hot carrier effects. The step of analyzing may include the steps of performing electrical tests with the second depth at a plurality of different depths, and selecting the depth having best performance. The step of analyzing may include the step of identifying structures likely to cause hot carrier effects. The step of analyzing may include the step of identifying chemical properties likely to cause hot carrier effects These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides a semiconductor device and structures which reduces or prevents hot carrier reliability problems in a field effect transistor. The present invention advantageously provides a conductive buried channel layer which has its depth adjusted to avoid regions where increased charge trapping may occur. In this way, charge trapping and parasitic junction sidewall leakage are reduced or eliminated. The present invention will be described in terms of a metal oxide semiconductor (MOS) device, in particular a PMOS device, for illustrative purposes, and the present invention should not be construed as being limited to the illustrative examples. It is to be understood that other device types (e.g., NMOS) or device structures may be employed in accordance with the present invention. The present invention may be employed with any semiconductor device, and preferably, in semiconductor devices which employ CMOS technology.

Figure 1:
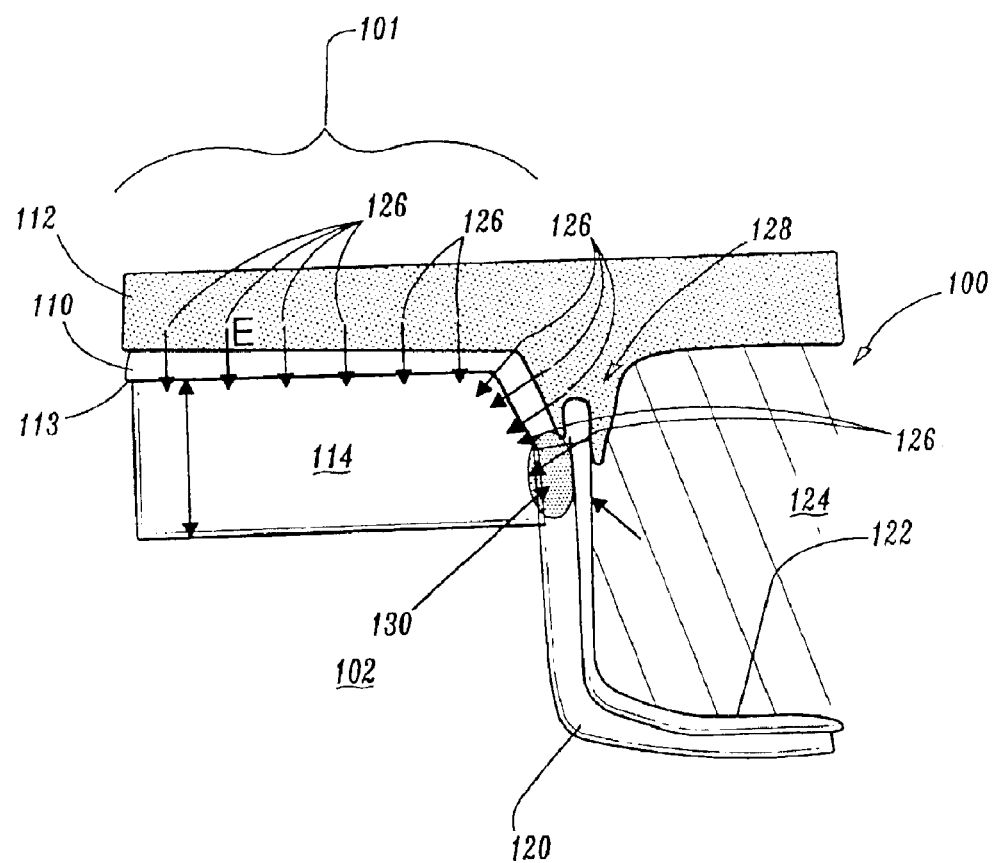
FIG. 1 is a cross-sectional view of a prior art device suffering from parasitic leakage by parasitic sidewall activation during hot carrier induced degradation which includes a region with high charge trapping caused by the STI process.
Figure 2:
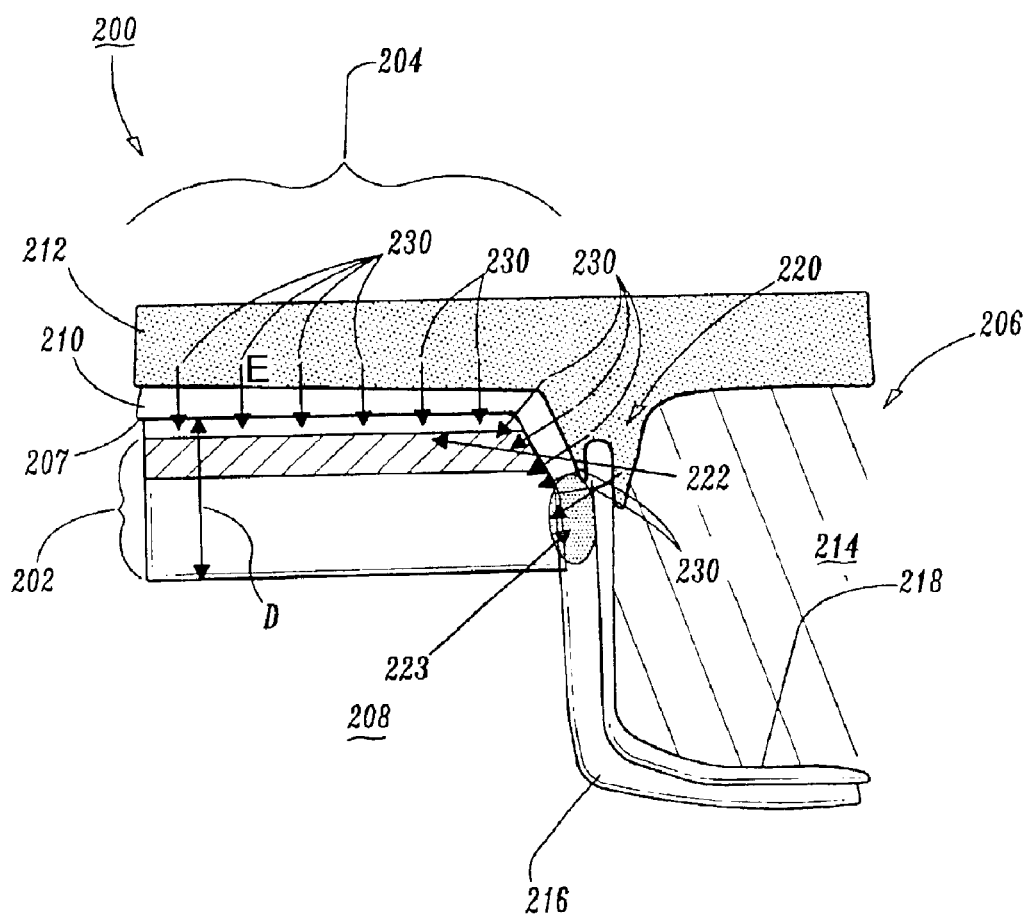
FIG. 2 is a cross-sectional view of a semiconductor device, taken at section line 2—2 in FIG. 3, with reduced parasitic sidewall activation during hot carrier induction where a conductive buried channel is moved away from the region of enhanced trapping in accordance with the present invention.
Figure 3:
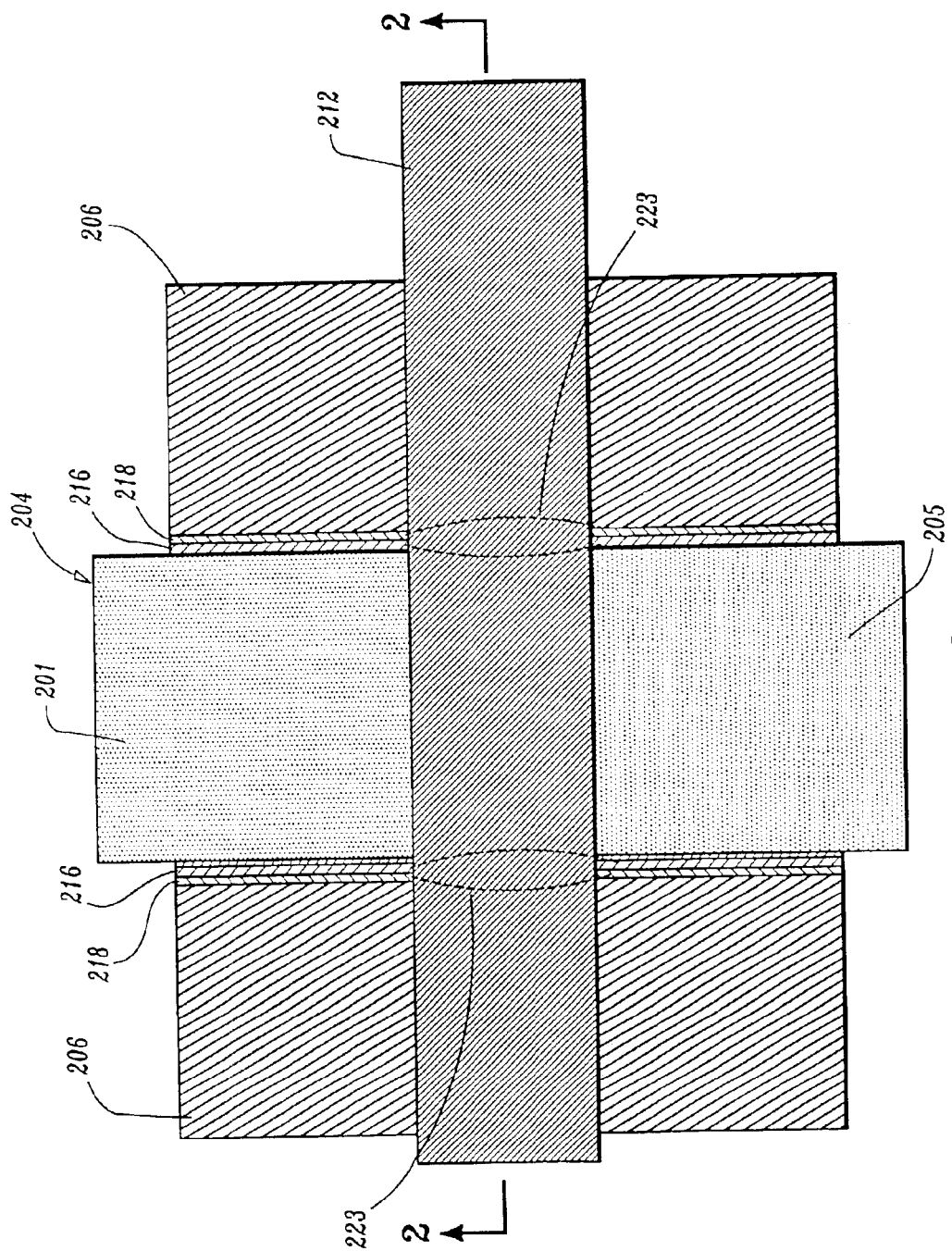
FIG. 3 is a top view with portion of a gate dielectric and a gate conductor removed showing a parasitic sidewall device.

Referring now in specific detail to the drawings in which like reference numerals identify similar or identical elements throughout the several views, and initially to FIG. 2, one embodiment of present invention is shown. A semiconductor device structure 200 includes a transistor junction 202 (e.g., a channel region disposed between a source region 201 and a drain region 205 as shown in FIG. 3 as a top view of transistor 204).

Structure 200 includes a transistor 204 and a shallow trench isolation (STI) structure 206. STI 206 and transistor 204 are created in a silicon substrate 208. Transistor 204 includes a gate dielectric layer 210, preferably an oxide, formed on a surface 207 of substrate 208, and a gate conductor 212, preferably polysilicon, formed on gate dielectric layer 210. Transistor 204 includes junction 202, which abuts STI 206. In accordance with the present invention, STI 206 may include a dielectric filler material 214 without a nitride liner, although an oxide layer 216 and a nitride layer or liner 218 may also be employed. STI 206 electrically isolates a sidewall of transistor 204. It is to be understood that any isolation structure or region may be employed instead of or in addition to the STI regions described herein.

Junction 202 includes a diffusion region having dopants extending from surface 207 down to a junction depth, D. Junction depth D extends to depth which overlaps STI 206 and is adjacent to a divot region 220. As described above, a region 223 of increased localized charge trapping exists as a result of processing STI region. In this case, a divot region 220 and nitride liner 218 are present as a result of the formation of STI 206. It is to be understood that region 223 may be the result of other processing effects or structural discontinuities, for example, localized concentration of dopants, interface or surface states (existing carriers due at interfaces between e.g., substrate 102 and other materials, such as, gate dielectric 210), dislocations in the substrate crystal, etc.

In accordance with the present invention, a conductive buried channel layer 222 is provided within junction 202 during operation. Conductive buried channel layer 222 includes a region of peak conduction, e.g., the highest concentration of carriers. Conductive buried channel layer 222 is advantageously offset from region 223 in accordance with the invention. In this way, the possibility of activation of a parasitic sidewall device in region 223 during hot carrier stresses is reduced or eliminated.

By moving conductive buried channel layer 222 as far away from region 223 within junction depth D, the charge injection point is away from the possible process induced enhanced charge trapping region 223 along the sidewall or transistor 204. This results in greater control of the threshold voltage $V_{th}$ of transistor 204 and prevents damage to the device during hot carrier stresses.

Placement of buried channel junction layer 222 may be provided by setting dopant implantation parameters, such as ion implant energy, by known processes, for example, to provide dopants at an appropriate depth. Conductive buried channel layer 222 may include dopants such as, for example B, As, P, and/or $BF_2$ depending on the type of transistor being employed (e.g., p-type or n-type). If transistor 204 includes a p-type transistor, conductive buried channel layer 222 preferably includes B or $BF_2$ dopants. If transistor 204 includes an n-type transistor, conductive buried channel layer 222 preferably include As dopants.

In accordance with the present invention, when gate conductor 212 is activated, an electric field, E, is applied to junction 202 as indicated by electric field lines 230 and conduction occurs through junction 202. Since the charge injection point (e.g., conductive buried channel layer 222) is away from region 223 activation of the parasitic device of region 223 is thwarted resulting in a significant reduction in leakage current.

Figure 4:
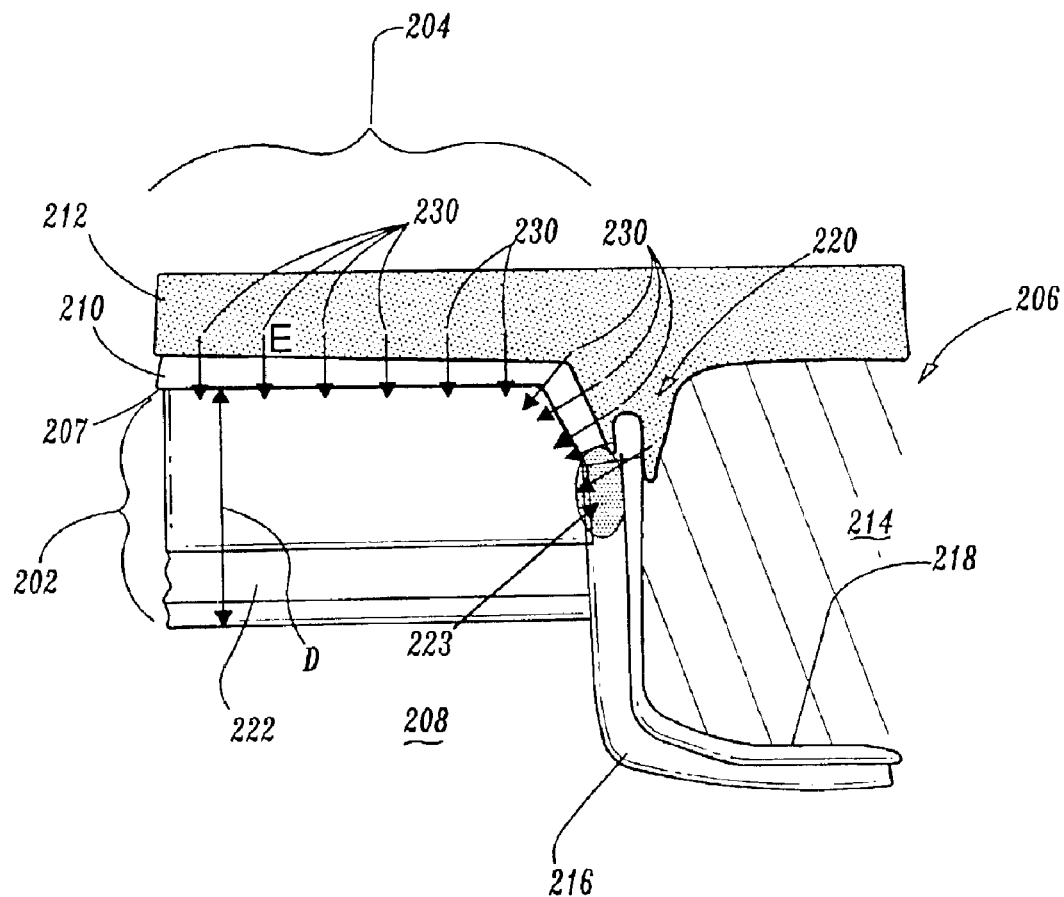
FIG. 4 is a cross-sectional view of a semiconductor device with reduced parasitic sidewall activation during hot carrier damage where a conductive buried channel is moved below the region of enhanced trapping in accordance with the present invention.

Conductive buried channel layer 222 may be formed above or below region 223. In FIG. 4, conductive buried channel layer 222 is illustratively shown below region 223. In preferred embodiments, conductive buried channel layer 222 is closer to surface 207 to improve speed of transistor 204.

Figure 5:
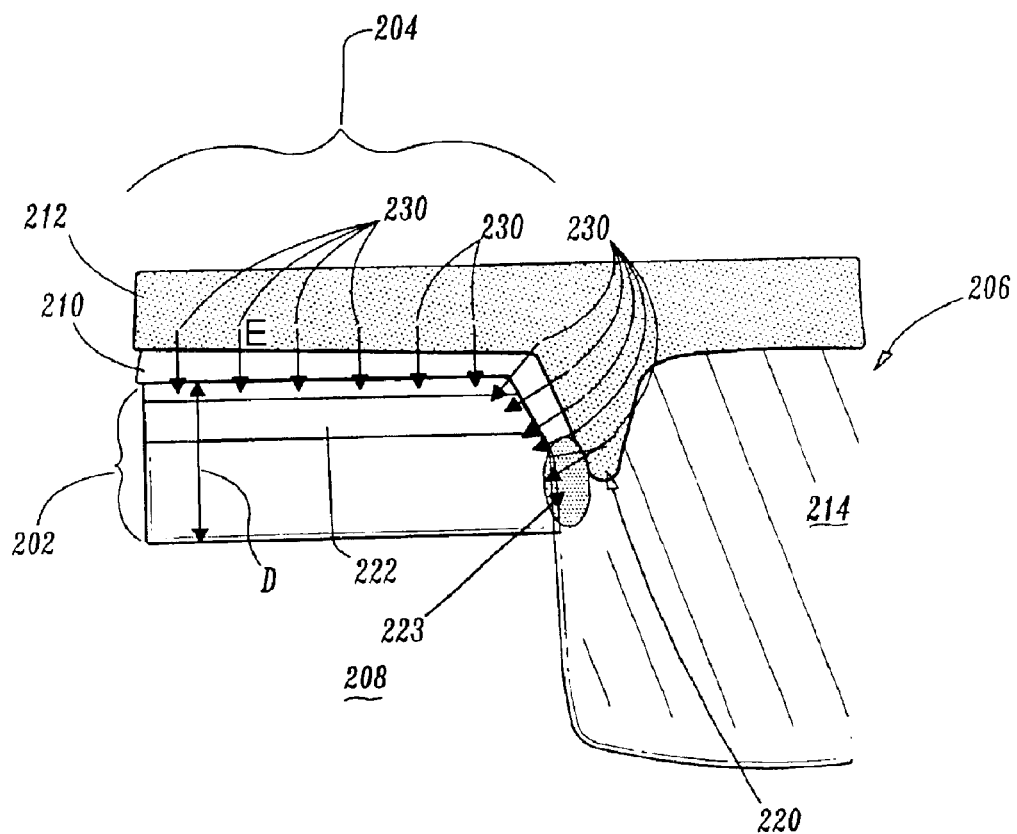
FIG. 5 is a cross-sectional view of a semiconductor device with reduced parasitic sidewall activation during hot carrier induction where the STI does not include a nitride liner in accordance with the present invention.

Advantageously, the present invention may be employed with STI structures 206 with or without nitride liner 218. As shown in FIG. 5, STI structure 206 no longer includes nitride liner 218 (FIG. 2). Other isolation structures may also be employed.

The present invention reduces the hot carrier induced sidewall activation in, for example, buried channel PMOS-FETs (NMOSFETs) by optimizing the conductive buried channel depth by providing an appropriate buried channel junction profile so that the point of electron injection along the conducting buried channel, and the STI sidewall is moved away from the region of possible enhanced electron trapping due to the isolation process. The appropriate buried channel junction profile is preferably achieved by moving the peak dopant concentration away from the sensitive area.

In the examples presented below, a buried channel PMOSFET with an STI having a nitride liner is employed. The reduction in parasitic sidewall activation is achieved, in the examples, by moving the conductive buried channel closer to the surface. It is to be understood, however, that the present invention may be implemented in any buried channel device technology with device isolation processes that can produce enhanced localized sidewall electron trapping sensitivities. The present invention should not be construed as limited to STI technologies with a nitride liner.

EXPERIMENTAL DATA

Figure 6:
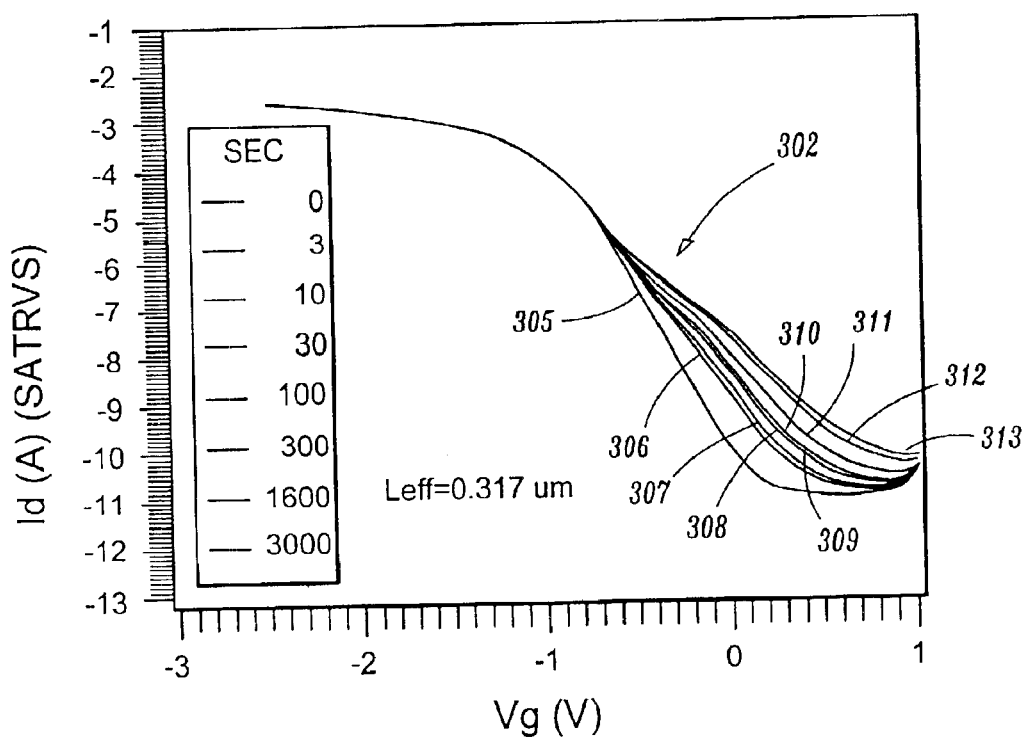
FIG. 6 is a plot of current versus gate voltage for a device having a conductive buried channel layer close to the enhanced electron trapping area showing increased parasitic sidewall activation.

Experiments to support the present invention were run on buried channel PFET devices having a nitride liner in the STI. Referring to FIG. 6, a plot is provided for a conductive buried channel which has a depth close to an enhanced electron trapping area. The plot shows channel current Id versus gate voltage Vg of the device under test. A family of curves 302 are plotted for selected times: 0 seconds (curve 305), 3 seconds (curve 306), 10 seconds (curve 307), 30 seconds (curve 308), 100 seconds (curve 309), 300 seconds (curve 310), 1600 seconds (curve 312), and 3,000 seconds (curve 313). As is apparent from curves 302 increased parasitic sidewall activation is experienced resulting in leakage and degraded performance over time. The device tested included a channel length Leff=0.317 microns. The conductive buried channel implant included boron implanted at 10 keV with a dose of $6 \times 10^{12}$ atoms/$cm^3$.

Figure 7:
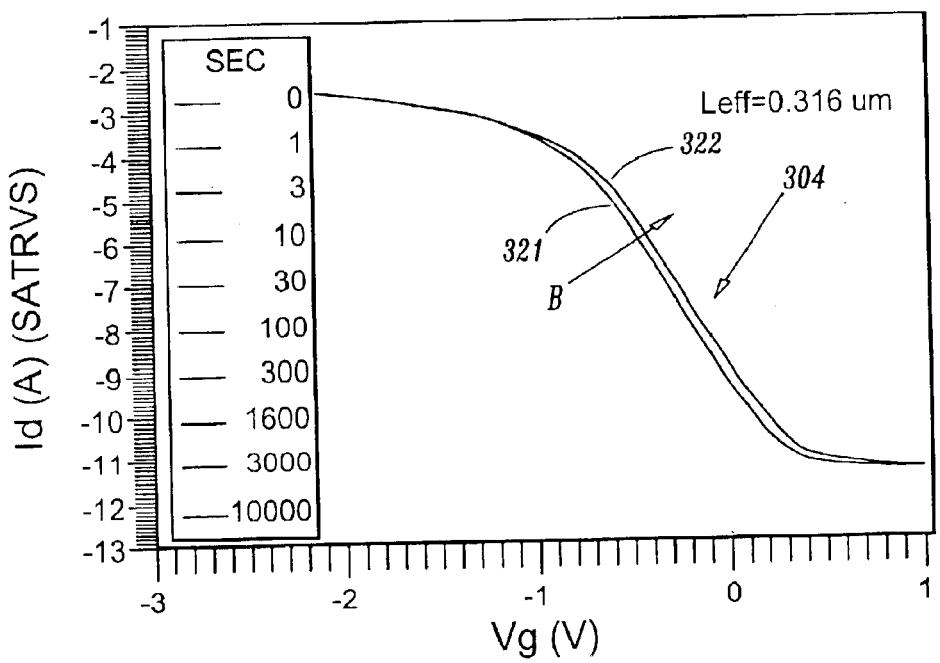
FIG. 7 is a plot of current versus gate voltage for a device having a conductive buried channel layer away from to the enhanced electron trapping area showing a reduction in parasitic sidewall activation in accordance with the invention.

Referring to FIG. 7, a plot is provided for a conductive buried channel which has a depth away from an enhanced electron trapping area in accordance with the present invention. The plot shows channel current Id versus gate voltage Vg of the device under test. A family of curves 320 are plotted for selected times: 0 seconds, 3 seconds, 10 seconds, 30 seconds, 100 seconds, 300 seconds, 1600 seconds, 3,000 seconds, and 10,000 seconds. The 0 second curve (curve 321) is the lowest increasing in the direction of arrow "B" to the 10,000 second curve (curve 322) at the top of curves 320. As is apparent, curves 320 show significant uniformity over time as compared to curves 302 of FIG. 6. Parasitic sidewall activation is dramatically reduced or not experienced at all. The device tested included a channel length Leff=0.316 microns. The conductive buried channel implant includes $BF_2$ implanted at 20 keV with a dose of $1 \times 10^{13}$ atoms/$cm^3$. The buried conductive channel peak was at a depth of about 400 angstroms.

Figure 8:
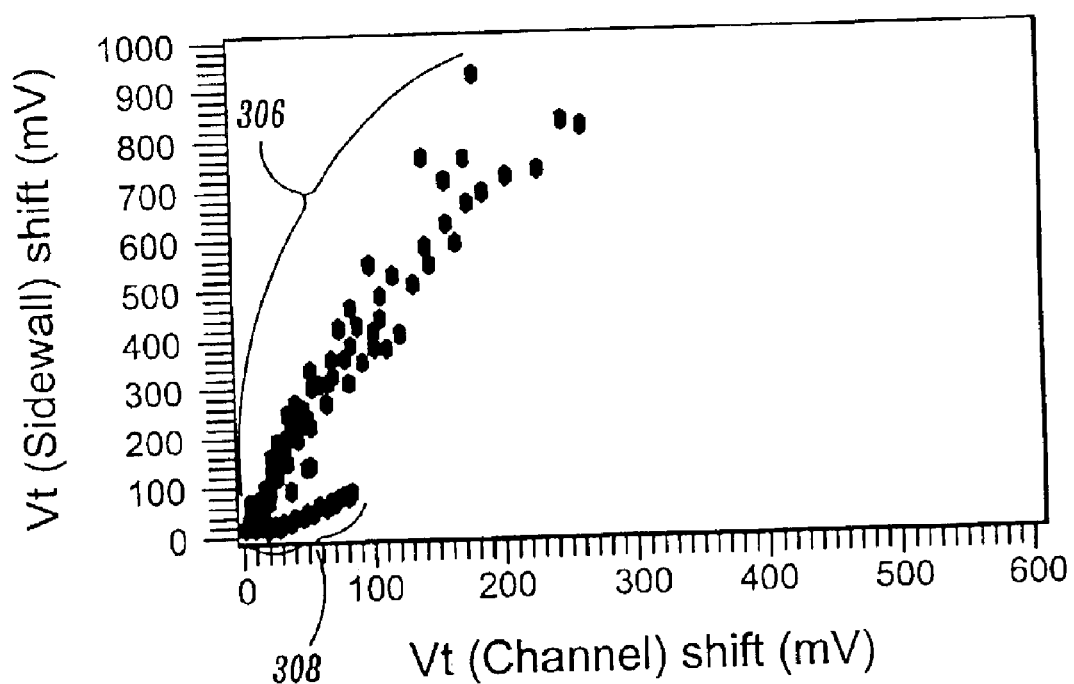
FIG. 8 is a plot comparing a device having a conductive buried channel layer away from to the enhanced electron trapping area in accordance with the invention and a device having a conductive buried channel layer close to the enhanced electron trapping area showing a reduction in parasitic sidewall activation.

Referring to FIG. 8, a graph showing a threshold voltage shift (Vt (sidewall) shift) of a sidewall parasitic device (e.g., the parasitic device in region 223 in FIG. 2) is plotted versus a threshold voltage shift (Vt (channel) shift) for the transistor channel (e.g., the channel of transistor 204 in FIG. 2). A first set of data points 306 represents the data for a conductive buried channel which has a depth close to an enhanced electron trapping area. Data points 306 correspond to Vt (sidewall) shift measured at a given Id value in FIG. 6 (e.g., Id=1.6 nA/$L_{des}$ (design length of the device)). A second set of data points 308 (e.g., measured at Id corresponding to 20 nA $Width_{des}$/$Length_{des}$, where $Width_{des}$, is the width and $Length_{des}$ is the length of the transistor) represents the data for a conductive buried channel which has a depth away from an enhanced electron trapping area as provided by the present invention. The device of the present invention (data points 308) shows dramatically less sensitivity to parasitic sidewall activation. Data points 308 indicate a substantially linear relationship (Vt(sidewall)shift=Vt(channel shift)).

Experimental data for conductive hot carrier stresses, run at about the same conditions, for a device in accordance with the present invention and a device with a conductive buried channel which has a depth close to an enhanced electron trapping area showed, among other things, that:

1) no enhanced sidewall activation for the device of the present invention; and
2) improvements were observed at any channel length of the devices.

In one instance, a buried channel junction extends to around 400–1000 angstroms below a silicon substrate surface, while the buried conductive channel may be around 100–400 angstroms below the surface. Other configurations are contemplated as well.

Figure 9:
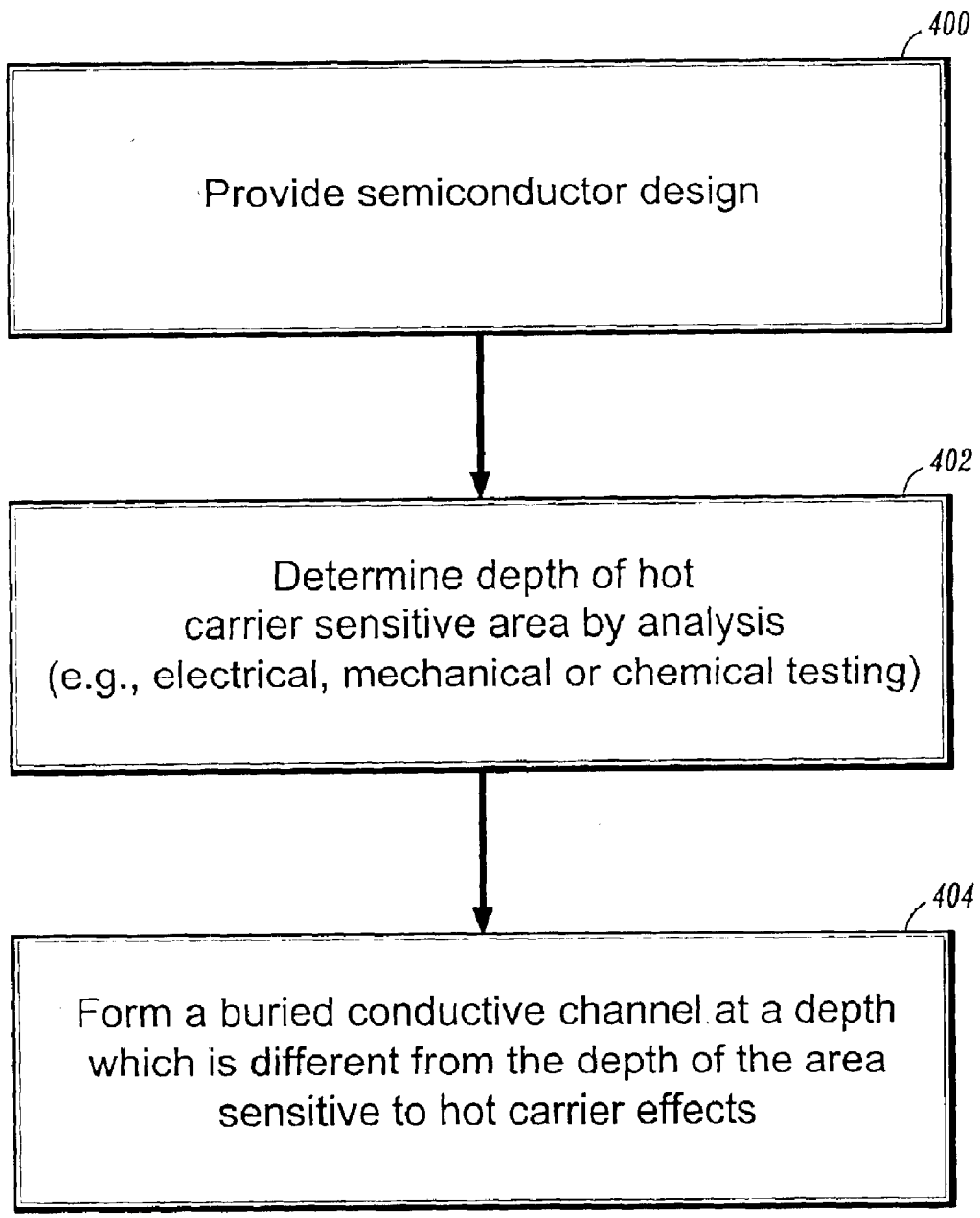
FIG. 9 is a flow diagram for reducing hot carrier effects in a transistor device in accordance with the present invention.

Referring to FIG. 9, a flow diagram is shown for reducing hot carrier effects in a semiconductor device. In block 400, a transistor structure is provided on a semiconductor chip. In block 402, a depth sensitive to hot carrier damage is determined. This may be determined by electrical, chemical or mechanical testing, for example. Electrical testing may include operating a device under specified conditions to determine parasitic leakage. Devices may then be fabricated with buried conductive channel layers at different depths to determine if parasitic leakage or hot carrier damage is reduced over a device previously tested (e.g., trial and error method). The depth at which parasitic leakage and/or damage is reduced or optimal is then selected as a design depth for the buried conductive channel layer in block 404.

In block 402, mechanical tests may be performed to determine structural causes for hot carrier damage. Semiconductor chip cross-sectioning may be performed by known methods to visually inspect potential regions where hot carrier effects may occur. The divot region and/or nitride layer formed in the STI process described above are examples of structurally caused hot carrier trapping regions. A depth of a buried conductive layer is then selected to avoid the hot carrier trapping region in block 404.

Figure 10:
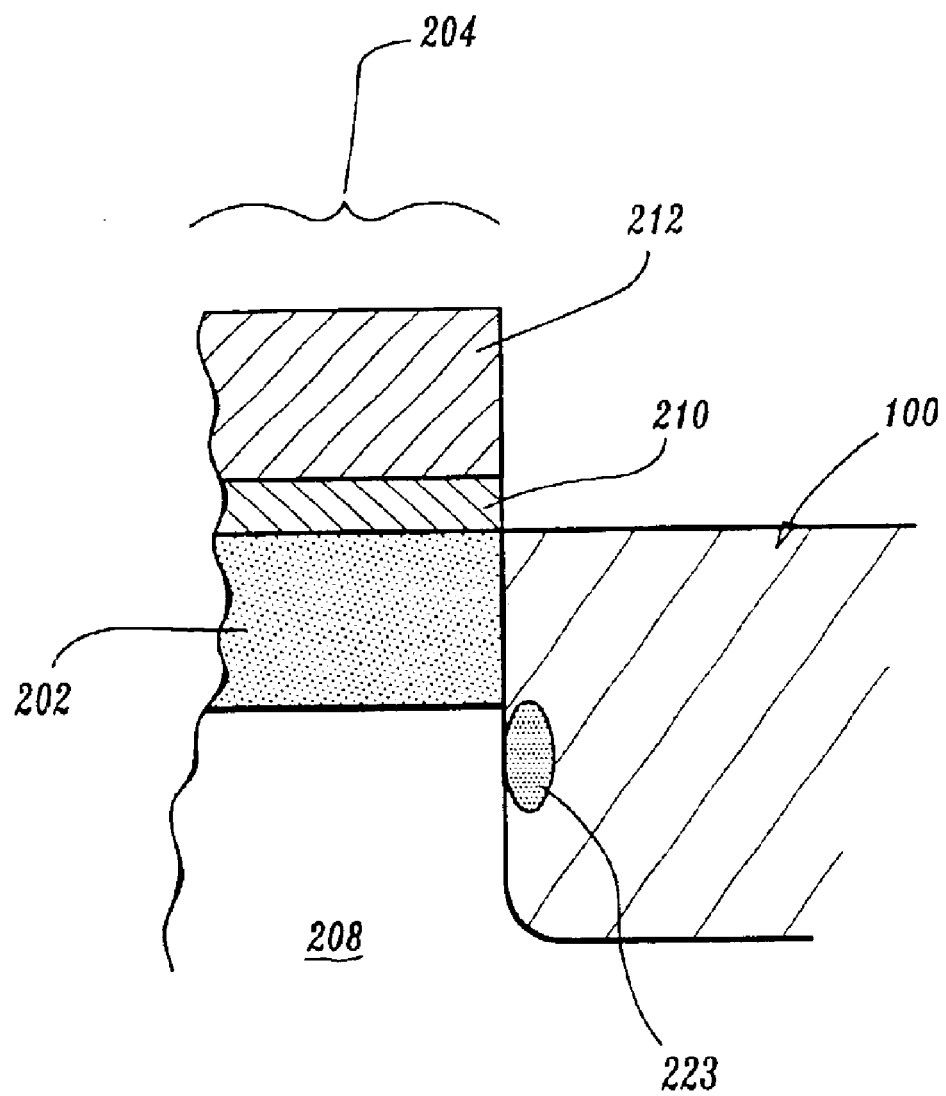
FIG. 10 is a cross-sectional view of a semiconductor device with reduced parasitic sidewall activation during hot carrier induction where an entire junction is moved away from the region of enhanced trapping in accordance with the present invention.

In block 402, chemical testing for chemical properties may be employed by, for example, spectroscopy methods, known in the art, on sectioned devices to determine surface or interface states or regions of localized dopant concentrations which may reveal a hot carrier trapping region. Other analysis may also be performed in block 402 to determine hot carrier trapping regions. A depth of a buried conductive layer is then selected to avoid the hot carrier trapping region in block 404 in accordance with the invention. In block 404, not only the buried conductive layer is offset from damage region, but a depth of the entire junction 202 may be formed at a different depth (above or below) a depth of damage region 223, as shown in FIG. 10.

Having described preferred embodiments for reduced hot carrier induced parasitic sidewall device activation in isolated buried channel devices by conductive buried channel depth optimization (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor device, comprising:
    a transistor junction formed in a substrate adjacent to an isolation region, a region between the transistor junction and the isolation region including an area susceptible to hot carrier effects, the transistor junction extending from a surface of the substrate to a first depth; and
    a buried conductive channel layer formed within the transistor junction between the surface of the substrate and the first depth, the buried conductive channel layer having a peak conduction depth which is different than a depth of the area susceptible to hot carrier effects, wherein the peak conduction depth is below the depth of the area susceptible to hot carrier effects.

2. The semiconductor device as recited in claim 1, wherein the isolation region includes a shallow trench isolation region.

3. The semiconductor device as recited in claim 2, wherein the shallow trench isolation region includes a nitride liner and the area susceptible to hot carrier effects includes an area between the nitride liner and the transistor junction.

4. The semiconductor device as recited in claim 1, wherein the buried conductive channel layer includes at least one of boron and boron difluoride dopants.

5. The semiconductor device as recited in claim 1, wherein the buried conductive channel layer includes arsenic dopants.

6. A semiconductor device, comprising:
    a transistor device formed in a substrate adjacent to an isolation region, the transistor device comprising a junction region activated by a gate conductor to conduct charge through the junction region, the junction region extending from a surface of the substrate to a first depth;
    a region disposed between the junction region and the isolation region including an area susceptible to charge trapping; and
    a charge injection region formed in the junction to provide a peak charge transfer layer through the junction region, the charge injection region having a peak conduction depth which is different than a depth of the area susceptible to charge trapping, wherein the peak conduction depth is below the depth of the area susceptible to charge trapping.

7. The semiconductor device as recited in claim 6, wherein the isolation region includes a shallow trench isolation region.

8. The semiconductor device as recited in claim 7, wherein the shallow trench isolation region includes a nitride liner and the area susceptible to charge trapping includes an area between the nitride liner and the junction region.

9. The semiconductor device as recited in claim 6, wherein the charge injection region includes a buried conductive channel layer.

10. The semiconductor device as recited in claim 6, wherein the charge injection region includes dopants.

11. The semiconductor device as recited in claim 10, wherein the dopants include at least one of boron and boron difluoride dopants.

12. The semiconductor device as recited in claim 10, wherein the buried conductive channel layer includes arsenic dopants.

13. A semiconductor device, comprising:
    a transistor device formed in a substrate adjacent to an isolation region, the transistor device comprising a junction region activated by a gate conductor to conduct charge through the junction region, the junction region extending from a surface of the substrate to a first depth;
    a region disposed between the junction region and the isolation region including an area susceptible to charge trapping; and
    a charge injection region formed in the junction to provide a peak charge transfer layer through the junction region, the charge injection region having a peak conduction depth which is different than a depth of the area susceptible to charge trapping,
    wherein the region disposed between the junction region and the isolation region includes a divot disposed between the junction region and the isolation region, the divot being filled by the gate conductor.

14. The semiconductor device as recited in claim 13, wherein the isolation region includes a shallow trench isolation region.

15. The semiconductor device as recited in claim 14, wherein the shallow trench isolation region includes a nitride liner and the area susceptible to charge trapping includes an area between the nitride liner and the junction region.

16. The semiconductor device as recited in claim 13, wherein the charge injection region includes a buried conductive channel layer.

17. The semiconductor device as recited in claim 13, wherein the charge injection region includes dopants.

18. The semiconductor device as recited in claim 17, wherein the dopants include at least one of boron and boron difluoride dopants.

19. The semiconductor device as recited in claim 13, wherein the buried conductive channel layer includes arsenic dopants.

* * * * *